(12) United States Patent
Chavva

(10) Patent No.: US 11,574,950 B2
(45) Date of Patent: Feb. 7, 2023

(54) METHOD FOR FABRICATION OF NIR CMOS IMAGE SENSOR

(71) Applicant: Applied Materials, Inc., Santa Clara, CA (US)

(72) Inventor: Venkataramana R. Chavva, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 191 days.

(21) Appl. No.: 17/101,578

(22) Filed: Nov. 23, 2020

(65) Prior Publication Data

US 2022/0165783 A1 May 26, 2022

(51) Int. Cl.
*H01L 27/146* (2006.01)
*H01L 31/18* (2006.01)

(52) U.S. Cl.
CPC .. *H01L 27/14687* (2013.01); *H01L 27/14685* (2013.01); *H01L 27/14689* (2013.01); *H01L 27/14698* (2013.01); *H01L 31/1892* (2013.01)

(58) Field of Classification Search
CPC ......... H01L 27/14687; H01L 27/14685; H01L 27/14689; H01L 27/14698; H01L 27/1463; H01L 31/1892
See application file for complete search history.

(56) References Cited

U.S. PATENT DOCUMENTS

| 2014/0160335 | A1* | 6/2014 | Shimotsusa | H01L 27/14627 438/69 |
| 2015/0311247 | A1* | 10/2015 | Chen | H01L 27/14623 257/432 |
| 2017/0117309 | A1* | 4/2017 | Chen | H01L 27/1463 |
| 2021/0074747 | A1* | 3/2021 | Takahashi | H01L 27/14636 |
| 2021/0193705 | A1* | 6/2021 | Chiu | G03F 7/094 |

* cited by examiner

*Primary Examiner* — Mounir S Amer
*Assistant Examiner* — Alexander Belousov
(74) *Attorney, Agent, or Firm* — Nields, Lemack & Frame, LLC

(57) ABSTRACT

A method of fabricating CMOS image sensors is disclosed. In contrast to traditional fabrication processes, the present sequence implants dopants into the epitaxial layer from both the first surface and the second surface. Because dopant is introduced through both sides, the maximum implant energy to perform the implant may be reduced by as much as 50%. In certain embodiments, the second implant is performed prior to the application of the electrical contacts. In another embodiments, the second implant is performed after the application of the electrical contacts. This method may allow deeper photodiodes to be fabricated using currently available semiconductor processing equipment than would otherwise be possible.

10 Claims, 6 Drawing Sheets

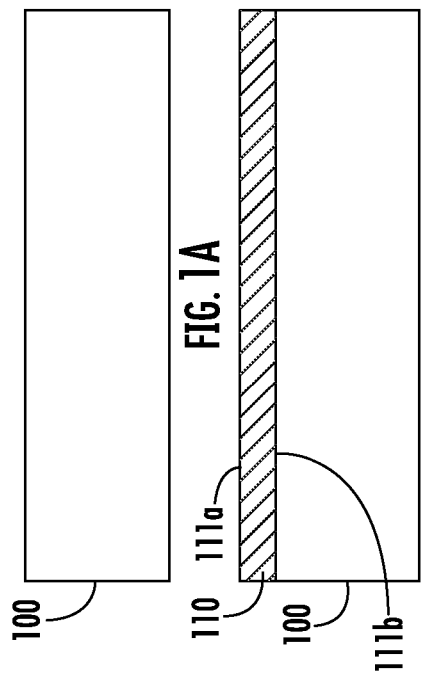
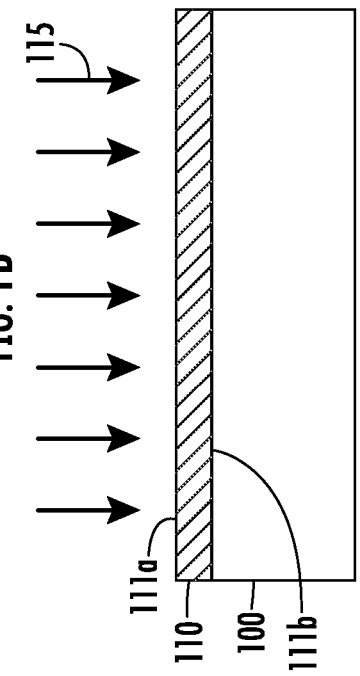
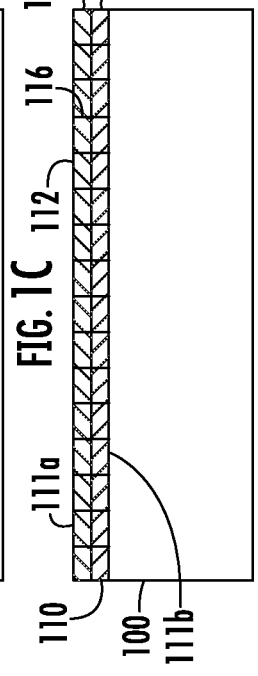
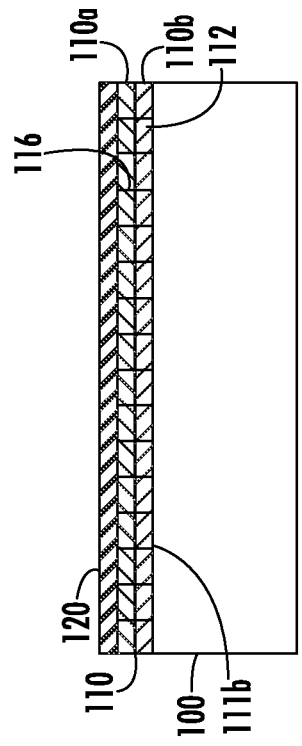
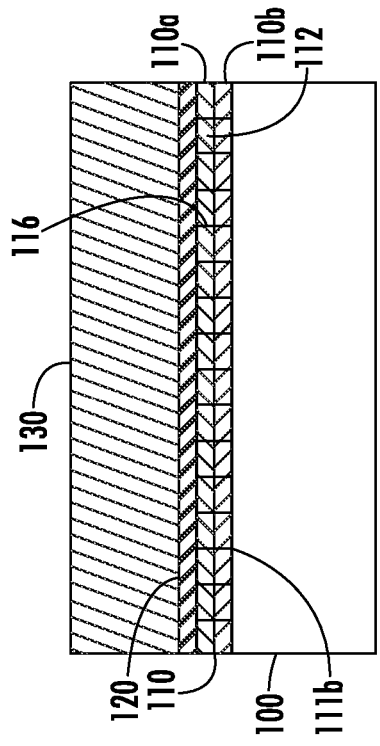
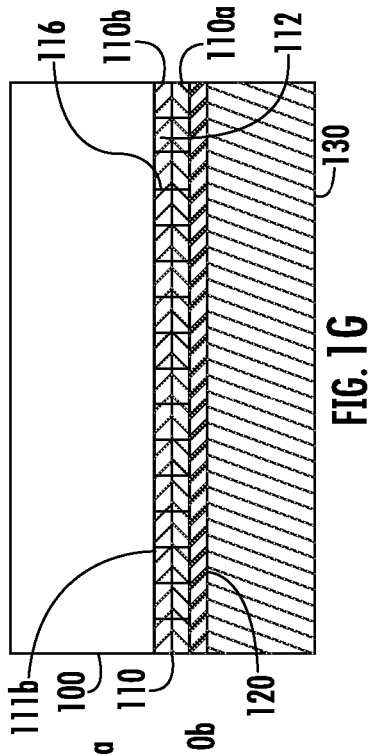

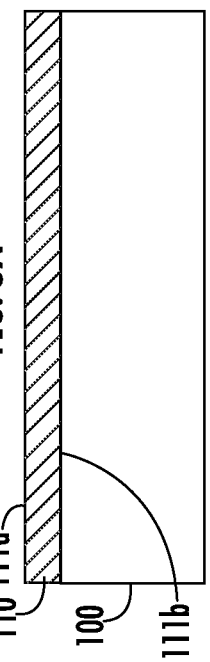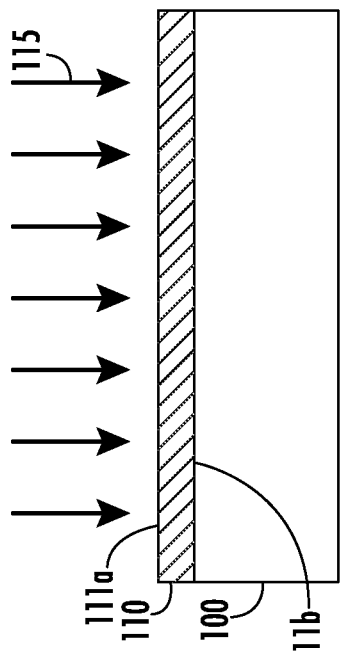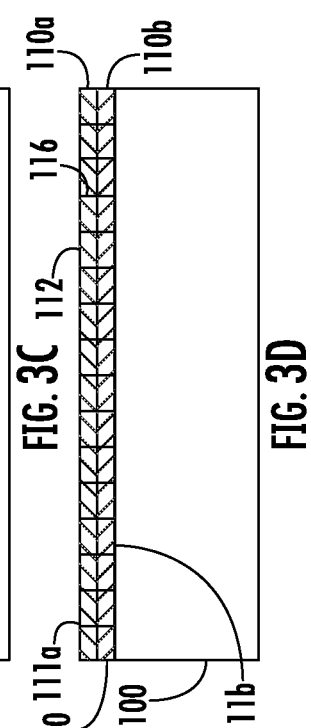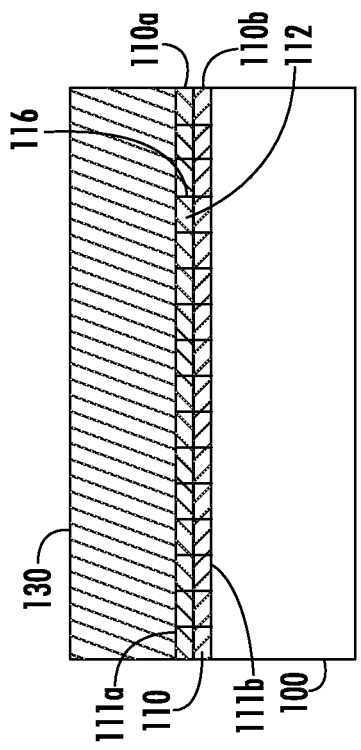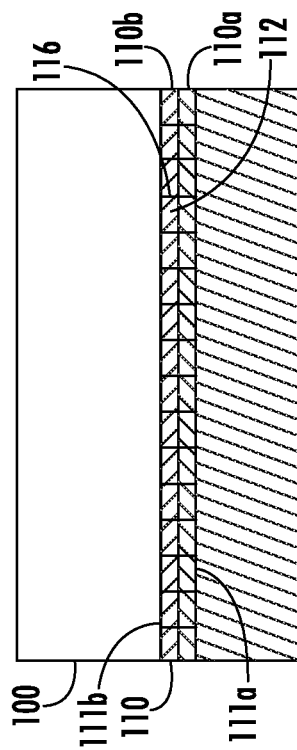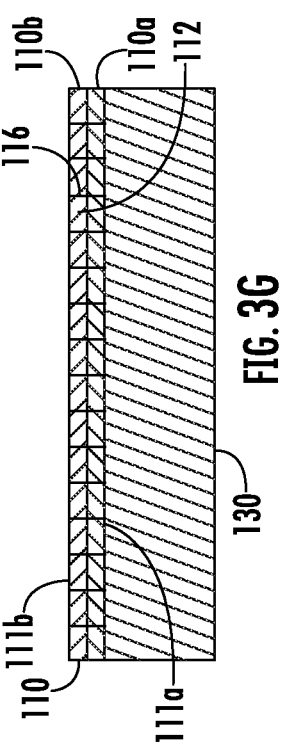

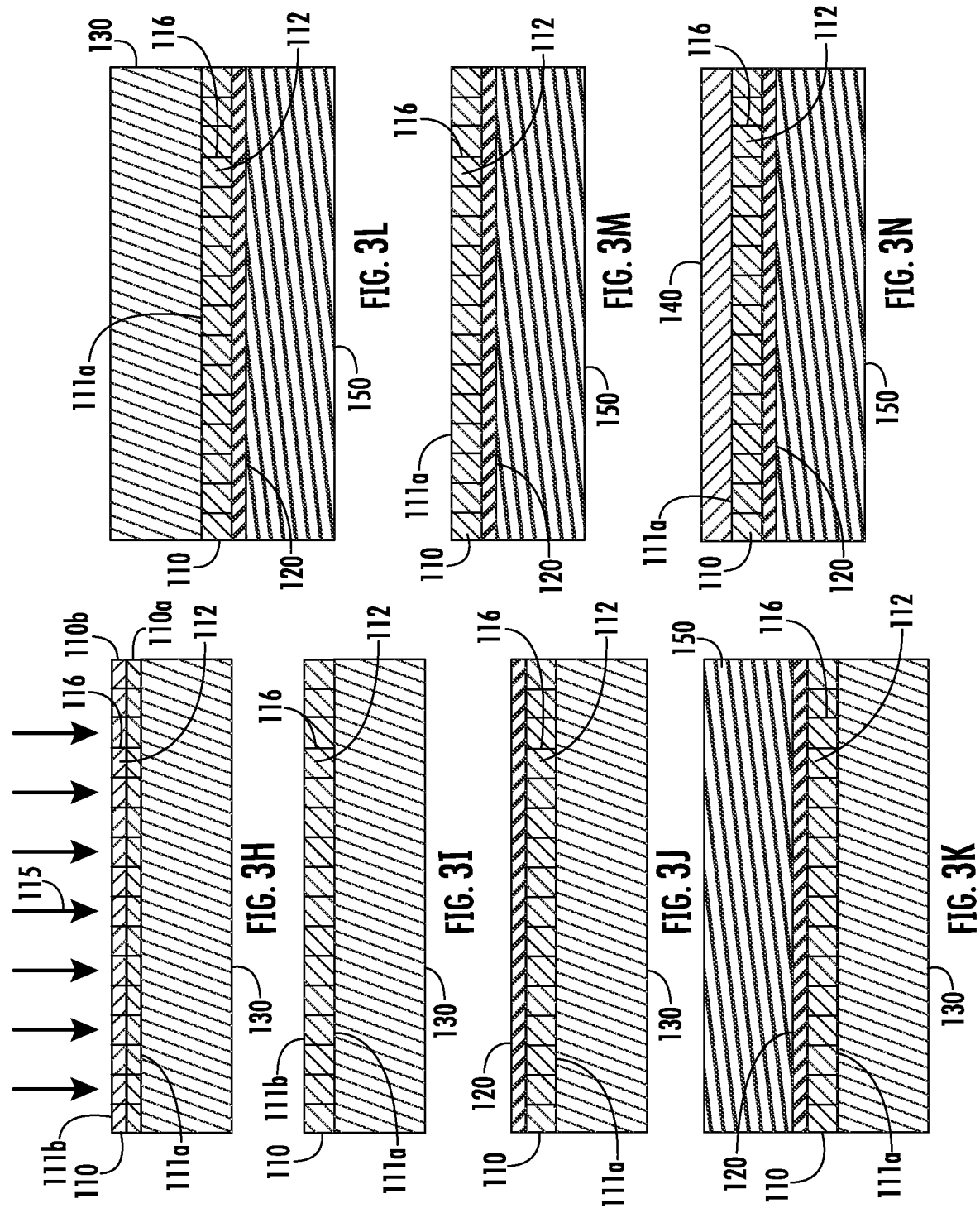

METHOD FOR FABRICATION OF NIR CMOS IMAGE SENSOR

FIELD

Embodiments of this disclosure are directed to methods for fabricating a CMOS image sensor, and more particularly a back-illuminated near infrared image sensor having vertical photodiodes.

BACKGROUND

CMOS image sensors are used for many applications, including cameras, webcams, infrared sensor, proximity sensors and others. Over time, the demand for higher resolution of these image sensors has increased. More specifically, the demand for near infrared (NIR) sensors for thermal imaging in autonomous vehicles is expected to accelerate in the coming years.

One way to achieve higher resolution is to rearrange the image sensor so that the photodiodes are vertically oriented. In this way, the total volume that is used for each photodiode remains unchanged, but the surface area used by each photodiode is reduced. In this way, more photodiodes may be disposed in the same surface area.

As technology advances, these vertical photodiodes are becoming deeper and deeper. This increased depth creates issues regarding the introduction of dopant into these vertical photodiodes. More specifically, the energy used to implant dopant throughout the photodiode has become very high, such as in excess of 10 MeV or more. Further, future image sensors are likely to have even deeper photodiodes, exacerbating this issue.

Therefore, it would be beneficial if there was a method of fabricating an image sensor that utilized the implant energies that are currently employed. In this way, existing semiconductor processing equipment could continue to be used. Further, it would be advantageous if this method could be easily integrated into current fabrication processes.

SUMMARY

A method of fabricating CMOS image sensors is disclosed. In contrast to traditional fabrication processes, the present sequence implants dopants into the epitaxial layer from both the first surface and the second surface. Because dopant is introduced through both sides, the maximum implant energy to perform the implant may be reduced by as much as 50%. In certain embodiments, the second implant is performed prior to the application of the electrical contacts. In another embodiments, the second implant is performed after the application of the electrical contacts. This method may allow deeper photodiodes to be fabricated using currently available semiconductor processing equipment than would otherwise be possible.

According to one embodiment, a method of fabricating an image sensor is disclosed. The method comprises forming an epitaxial layer on a surface of a wafer, wherein a first surface of the epitaxial layer comprises an exposed surface and a second surface of the epitaxial layer is disposed on the surface of the wafer; performing a first implant by implanting dopant through the first surface and into the epitaxial layer; forming circuitry and electrical contacts on the first surface; bonding a handle wafer to the electrical contacts; thinning the wafer; performing a second implant by implanting dopant through the second surface and into the epitaxial layer; performing a thermal treatment to anneal the dopant; and forming optical components on the second surface. In certain embodiments, the first implant and the second implant are each performed using a plurality of implant energies. In some further embodiments, the maximum implant energy is selected such that dopant is implanted at a depth that is at least 50% of a thickness of the epitaxial layer. In some embodiments, the method further comprises creating deep trench isolation in the epitaxial layer. In some embodiments, the deep trench isolation is created by implanting a second dopant having an opposite conductivity as the dopant into the epitaxial layer through the first surface. In some embodiments, the deep trench isolation is created by implanting a second dopant having an opposite conductivity as the dopant into the epitaxial layer through the second surface. In certain embodiments, the dopant comprises a N-type dopant and the deep trench isolation is formed by implanting a P-type dopant. In some embodiments, the thermal treatment comprises a laser anneal. In certain embodiments, the thermal treatment is performed following the second implant and before forming the optical components.

According to another embodiment, a method of fabricating an image sensor is disclosed. The method comprises forming an epitaxial layer on a surface of a wafer, wherein a first surface of the epitaxial layer comprises an exposed surface and a second surface of the epitaxial layer is disposed on the surface of the wafer; performing a first implant by implanting dopant through the first surface and into the epitaxial layer; bonding a handle wafer to the first surface; thinning the wafer; performing a second implant by implanting dopant through the second surface and into the epitaxial layer; forming circuitry and electrical contacts on the second surface; performing a thermal treatment to anneal the dopant; bonding a second handle wafer to the electrical contacts; removing the handle wafer to expose the first surface; and forming optical components on the first surface. In certain embodiments, the first implant and the second implant are each performed using a plurality of implant energies. In some further embodiments, the maximum implant energy is selected such that dopant is implanted at a depth that is at least 50% of a thickness of the epitaxial layer. In some embodiments, the method further comprises creating deep trench isolation in the epitaxial layer. In some embodiments, the deep trench isolation is created by implanting a second dopant having an opposite conductivity as the dopant into the epitaxial layer through the first surface. In some embodiments, the deep trench isolation is created by implanting a second dopant having an opposite conductivity as the dopant into the epitaxial layer through the second surface. In certain embodiments, the dopant comprises a N-type dopant and the deep trench isolation is formed by implanting a P-type dopant. In some embodiments, the thermal treatment comprises a laser anneal. In certain embodiments, the thermal treatment is performed following the second implant and before forming the optical components.

BRIEF DESCRIPTION OF THE FIGURES

For a better understanding of the present disclosure, reference is made to the accompanying drawings, which are incorporated herein by reference and in which:

FIGS. 1A-1K shows a workpiece during various processes of a fabrication sequence that may be utilized to create an image sensor according to one embodiment;

FIGS. 3A-3N shows a workpiece during various processes of a fabrication sequence that may be utilized to create an image sensor according to one embodiment.

DETAILED DESCRIPTION

The present disclosure utilizes ion implants that are performed into both sides of a workpiece. By implanting ion through both sides of a workpiece, the implant energy that is used to reach the deepest depths is reduced.

FIGS. 1A-1K show the various processes that a workpiece undergoes during a fabrication sequence to create a CMOS image sensor according to one embodiment. This image sensor may be a near infrared (NIR) sensor.

Figure 2:
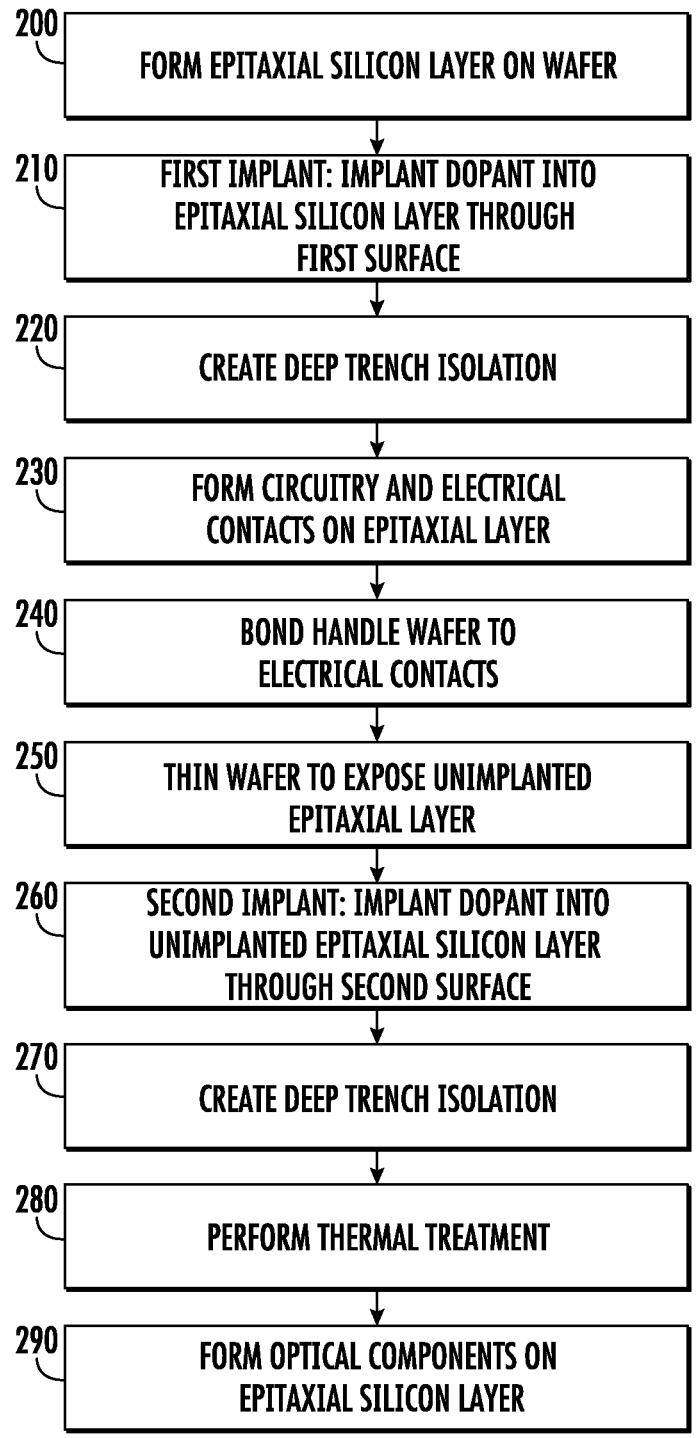
FIG. 2 shows a flowchart of the sequence shown in FIGS. 1A-1K.

FIG. 2 shows a flowchart that reflects the fabrication sequence used to create the CMOS image sensor according to this embodiment.

As shown in FIG. 1A, a wafer 100, such as a silicon wafer, is used. The wafer 100 may be about 750 μm thick.

Next, as shown in FIG. 1B and in Box 200 of FIG. 2, epitaxial layer 110 is grown on the top surface of the wafer 100. An epitaxial process may introduce a silicon-containing gas in a chamber containing the wafer 100. The epitaxial layer 110 may be partially or completely comprised of silicon. In some embodiments, the height of the epitaxial layer 110 may be greater than 5 μm. In certain embodiments, the height of the epitaxial layer 110 may be in excess of 10 μm. The epitaxial layer 110 has a first surface 111a, which is the top surface after growth, and a second surface 111b, opposite the first surface 111a, which contacts the wafer 100.

As shown in FIG. 1C and in Box 210 of FIG. 2, a first implant of dopant 115 is performed. Dopant 115 is implanted into the epitaxial layer 110 through the first surface 111a. In certain embodiments, the dopant 115 may be a n-type dopant, such as a Group 5 element, which may be phosphorus or arsenic. Multiple implants may be performed using different implant energies. These multiple implants may be used to create a concentration profile that resembles a box profile. The concentration of dopant in the epitaxial layer 110 may be 1E17 in certain embodiments. The depth of the implant having the greatest implant energy may be 50% or more of the total thickness of the epitaxial layer 110.

FIG. 1D shows the workpiece following the implant of dopant 115. Note that the epitaxial layer 110 is now bifurcated, where there is an implanted epitaxial layer 110a and an unimplanted epitaxial layer 110b. The implanted epitaxial layer 110a is disposed proximate the first surface 111a, while the unimplanted epitaxial layer 110b is proximate the second surface 111b. The dopant 115 is used to create photodiodes 112 in the epitaxial layer 110. As described above, these photodiodes 112 are vertically arranged, and have a depth that may be greater than the length or width. These photodiodes 112 may extend through much of the epitaxial layer 110. For example, if the epitaxial layer 110 is 10 μm thick, the photodiode 112 may have a thickness of 8 μm or more.

In certain embodiments, part or all of the deep trench isolation 116 may be created at this time as well. Deep trench isolation 116 is used to separate adjacent photodiodes 112 from one another to minimize crosstalk and interferences. In certain embodiments, the deep trench isolation is achieved by passivating with an implant the boundaries between adjacent photodiodes 112 with a second dopant having the opposite conductivity as the dopant 115 used to form the photodiodes 112. Thus, if the photodiode 112 is N-doped, the deep trench isolation 116 may be P-doped. The deep trench isolation may be created by implanting P-type dopants through the first surface 111a of the epitaxial layer 110.

In certain embodiments, as shown in Box 220 in FIG. 2, the first surface 111a of the epitaxial layer 110 is masked and then implanted with a p-type dopant, such as boron. Multiple implants at different implant energies may be used to create the deep trench isolation 116. Since, the deep trench isolation 116 is used to separate the photodiodes 112, it may extend as deep as the photodiodes 112. In other embodiments, the implants are performed at an implant energy such that the deep trench isolation 116 extends at least 50% of the thickness of the epitaxial layer 110.

Next, as shown in FIG. 1E and in Box 230 in FIG. 2, circuitry may be fabricated on the first surface 111a of the epitaxial layer 110. This circuitry may include poly-silicon gates. Additionally, bonding pads may be disposed on the first surface 111a of the epitaxial layer 110. In addition to the circuitry, there may be electrical contacts 120 on the first surface 111a of the epitaxial layer 110. Note that the circuitry and electrical contacts 120 are adjacent to the implanted epitaxial layer 110a. In certain embodiments, the electrical contacts 120 may be created through the application of one or more metallization layers.

As shown in FIG. 1F and in Box 240 of FIG. 2, a second wafer, which may be referred to as a handle wafer 130, is bonded to the electrical contacts 120. In one embodiment, the handle wafer 130 is secured to the top surface of the electrical contacts 120 through direct bonding. In this embodiment, a thin silicon oxide layer may be deposited, grown or otherwise formed on the top surface of the electrical contacts 120. A thin silicon oxide layer may also be deposited, grown, or otherwise formed on one surface of the handle wafer 130. These two thin silicon oxide layers may both be planarized, such as through the use of chemical mechanical polishing (CMP). These two thin silicon oxide layers are then pressed together, and bond together via direct silicon bonding. In another embodiment, the handle wafer 130 may be secure to the top surface of the electrical contacts using an adhesive.

The combined workpiece is then flipped, as shown in FIG. 1G.

Figure 1H:
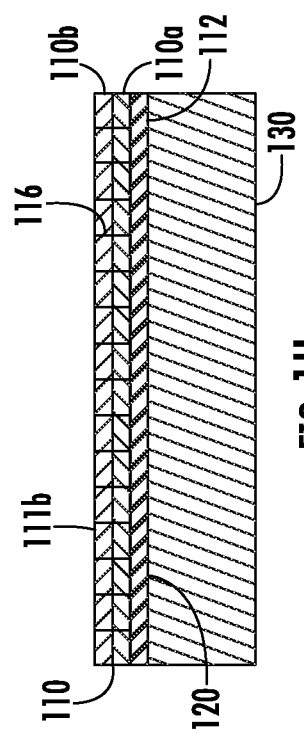

The wafer 100 is then thinned, as shown in FIG. 1H and in Box 250 of FIG. 2, such as through use of a CMP process. The wafer 100 may be thinned such that the second surface 111b of the epitaxial layer 110 is exposed. In other embodiments, a thin layer of the wafer 100 may remain after the CMP process.

Figure 1I:
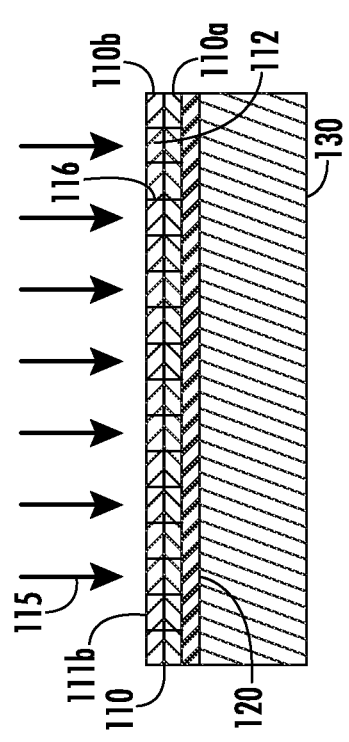

As shown in FIG. 1I and in Box 260 of FIG. 2, a second implant of dopant 115 is performed. Dopant 115 is implanted through the second surface 111b and into the unimplanted epitaxial layer 110b. In certain embodiments, the dopant 115 may be a n-type dopant, such as a Group 5 element, which may be phosphorus or arsenic. Multiple implants may be performed using different implant energies. These multiple implants may be used to create a concentration profile that resembles a box profile. The concentration of dopant in the epitaxial layer 110 may be 1E17 in certain embodiments. The depth of the implant having the greatest implant energy may be 50% or more of the total thickness of the epitaxial layer 110 such that, the dopant 115 from the second implant extends to the implanted epitaxial layer 110a. In other words, there is no undoped region in the middle of the epitaxial layer 110. In certain embodiments, the entirety of the epitaxial layer 110 is doped. However, in other embodiments, there may be less doped or undoped regions that are disposed near the first surface 111a or the second surface 111b.

In certain embodiments, as shown in Box 270 of FIG. 2, part or all of the deep trench isolation 116 may be created at this time as well. As described above, in certain embodiments, the deep trench isolation is achieved by doping the boundaries between adjacent photodiodes 112 by implanting a second dopant having the opposite conductivity as the dopant 115 used to form the photodiodes 112. Thus, if the photodiode 112 is N-doped, the deep trench isolation 116 may be P-doped.

In certain embodiments, the second surface 111b of the epitaxial layer 110 is masked and then implanted with a p-type dopant, such as boron. Multiple implants at different implant energies may be used to create the deep trench isolation 116. Specifically, the deep trench isolation 116 is used to separate the photodiodes 112. Thus, the deep trench isolation may extend as far as the photodiodes 112. In other embodiments, the implants are performed at an implant energy such that the deep trench isolation 116 extends at least 50% of the thickness of the epitaxial layer 110.

In certain embodiments, Box 220 may be omitted. In other embodiments, Box 270 may be omitted.

Figure 1J:
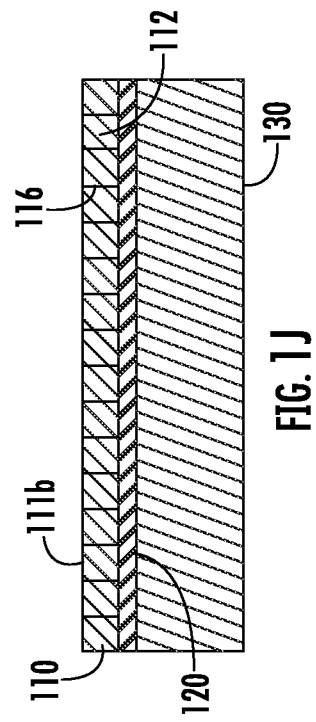

FIG. 1J shows the workpiece after the second implant is performed. At this point, the epitaxial layer 110 has been implanted with dopant 115 to form the photodiode 112. Furthermore, the deep trench isolation 116 has been fully formed.

In some embodiments, as shown in Box 280 of FIG. 2, a thermal treatment is performed at this time. The thermal treatment is performed such that the electrical contacts 120 are not damaged by this treatment. In certain embodiments, the thermal treatment may be a laser anneal.

In another embodiment, the thermal treatment may be performed at two different points in time. For example, a first thermal treatment may be performed following the first implant shown in FIG. 1D (i.e. Box 210 or Box 220), and the second thermal treatment may be performed following the second implant shown in FIG. 1I.

Figure 1K:
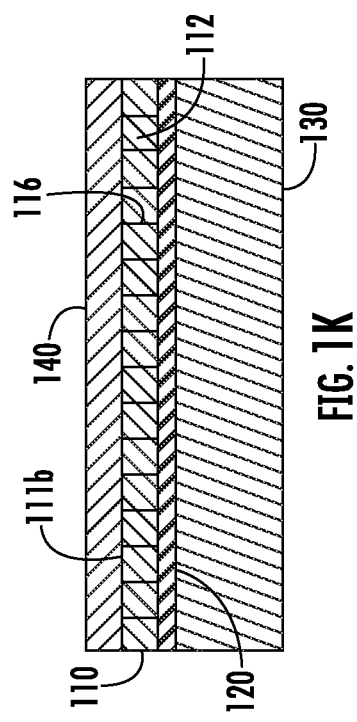

After the thermal treatment is performed, the optical components 140, which may comprise the antireflective coating, color filters, spacers, and microlenses, are formed on top of the second surface 111b of the epitaxial layer 110, as shown in FIG. 1K and in Box 290.

The image sensor can be integrated with a digital signal processor or other circuitry via the electrical contacts 120. For example, the handle wafer 130 may be removed to expose the electrical contacts 120.

This final workpiece is similar in structure to a traditional CMOS image sensor. However, unlike conventional CMOS image sensors, the implanting of the dopant 115 was performed from both sides of the epitaxial layer 110. This reduces the implant energy needed to create the desired concentration box profile in the photodiodes 112.

FIGS. 3A-3N show the various processes that a workpiece undergoes during a fabrication sequence to create a CMOS image sensor according to a second embodiment.

Figure 4:
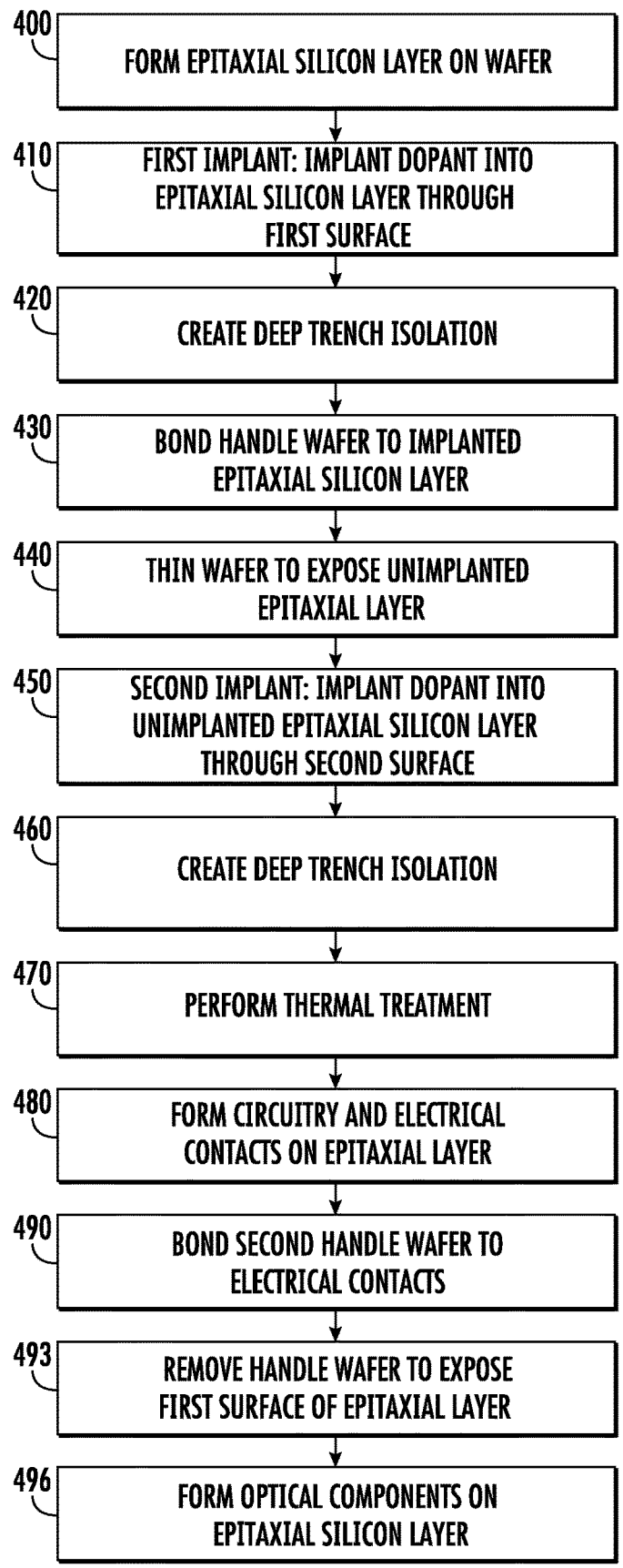
FIG. 4 shows a flowchart of the sequence shown in FIGS. 3A-3N.

FIG. 4 shows a flowchart that reflects the fabrication sequence used to create the CMOS image sensor according to this embodiment.

Note that FIGS. 3A-3D are the same as those described above with respect to the first embodiment and shown in FIGS. 1A-1D. Therefore, these processes will not be described again. Similarly, Boxes 400-420 of FIG. 4 are the same as Boxes 200-220 of FIG. 2.

In FIG. 3E and Box 430 of FIG. 4, a handle wafer 130 is bonded to the first surface 111a of the epitaxial layer 110, which is the top surface of the implanted epitaxial layer 110a. This bonding may be direct bonding and may be achieved using the technique described above with respect to FIG. 1F. In another embodiment, an adhesive may be used to bond the handle wafer 130 to the epitaxial layer 110.

The combined workpiece is then flipped, as shown in FIG. 3F.

The wafer 100 is then thinned, as shown in FIG. 3G and in Box 440 of FIG. 4, such as through use of a CMP process. The wafer 100 may be thinned such that the second surface 111b of the epitaxial layer 110 is exposed. In other embodiments, a thin layer of the wafer 100 may remain on the second surface 111b of the epitaxial layer 110.

As shown in FIG. 3H and in Box 450 of FIG. 4, a second implant of dopant 115 is performed. Dopant 115 is implanted through the second surface 111b and into the unimplanted epitaxial layer 110b. As described above, in certain embodiments, the dopant 115 may be a n-type dopant, such as a Group 5 element, which may be phosphorus or arsenic. Multiple implants may be performed using different implant energies. These multiple implants may be used to create a concentration profile that resembles a box profile. The concentration of dopant in the epitaxial layer 110 may be 1E17 in certain embodiments. The depth of the implant having the greatest implant energy may be 50% or more of the total thickness of the epitaxial layer 110 such that, the dopant 115 from the second implant extends to the implanted epitaxial layer 110a. In other words, there is no undoped region in the middle of the epitaxial layer 110. In certain embodiments, the entirety of the epitaxial layer 110 is doped. However, in other embodiments, there may be less doped or undoped regions that are disposed near the first surface 111a or the second surface 111b.

In certain embodiments, as shown in Box 460 of FIG. 4, part or all of the deep trench isolation 116 may be created at this time as well. As described above, in certain embodiments, the deep trench isolation is achieved by passivating with an implant the boundaries between adjacent photodiodes 112 with a second dopant having the opposite conductivity as the dopant 115 used to create the photodiode 112. Thus, if the photodiode 112 is N-doped, the deep trench isolation 116 may be P-doped.

In certain embodiments, the second surface 111b of the epitaxial layer 110 is masked and then implanted with a p-type dopant, such as boron. Multiple implants at different implant energies may be used to create the deep trench isolation 116. Specifically, the deep trench isolation 116 is used to separate the photodiodes 112. Thus, the deep trench isolation may extend as far as the photodiodes 112. In other embodiments, the implants are performed at an implant energy such that the deep trench isolation 116 extends at least 50% of the thickness of the epitaxial layer 110.

In certain embodiments, Box 420 may be omitted. In other embodiments, Box 460 may be omitted.

FIG. 3I shows the workpiece after the second implant is performed. At this point, the epitaxial layer 110 has been implanted with dopant 115. Furthermore, the deep trench isolation 116 has been fully formed.

In certain embodiments, as shown in Box 470 of FIG. 4, a thermal treatment may be performed after the second implant. This thermal treatment may be performed using a laser anneal or another process.

Next, as shown in FIG. 3J and in Box 480 in FIG. 4, circuitry may be fabricated on the second surface 111b of the epitaxial layer 110. This circuitry may include poly-silicon gates. Additionally, bonding pads may be disposed on the top surface of the epitaxial layer 110. In addition to the circuitry, there may be one or more electrical contacts 120 on the second surface 111b of the epitaxial layer 110.

As shown in FIG. 3K and in Box 490 of FIG. 4, a third wafer, which may be referred to as a second handle wafer 150, is bonded to the electrical contacts 120. In one embodiment, the second handle wafer 150 is secured to the top surface of the workpiece through direct bonding. In this embodiment, a thin silicon oxide layer may be deposited, grown or otherwise formed on the top surface of the electrical contacts 120. A thin silicon oxide layer may also be deposited, grown, or otherwise formed on one surface of the second handle wafer 150. These two thin silicon oxide layers may both be planarized, such as through the use of chemical mechanical polishing (CMP). These two thin silicon oxide layers are then pressed together, and bond together via direct silicon bonding. In another embodiment, the second handle wafer 150 is bonded using an adhesive.

The combined workpiece is then flipped, as shown in FIG. 3L.

The handle wafer 130 is then removed, as shown in FIG. 3M and in Box 493 of FIG. 4. This may be done through use of a CMP process. In another embodiment, the handle wafer 130 may be removed by applying heat or mechanical force. When the handle wafer 130 is removed, the first surface 111a of the epitaxial layer 110 is exposed.

In certain embodiments, a thermal treatment may be performed after the thinning. This thermal treatment may be performed so as not to damage the electrical contacts 120. This may be achieved using a laser anneal.

Finally, the optical components 140, which may comprise the antireflective coating, color filters, spacers, and microlenses, are formed on top of the first surface 111a of the epitaxial layer 110, as shown in FIG. 3N and in Box 496 of FIG. 4.

The image sensor can be integrated with a digital signal processor or other circuitry via the electrical contacts 120. For example, the second handle wafer 150 may be removed to expose the electrical contacts 120.

Again, this final workpiece is similar in structure to a traditional CMOS image sensor. However, unlike conventional CMOS image sensors, the implanting of the dopant 115 was performed from both sides of the epitaxial layer 110. This reduces the implant energy needed to create the desired concentration box profile in the photodiodes 112.

In fact, in certain embodiments, the fabrication process from Box 450 to Box 496 may be the same as is currently performed.

The methods described herein have many advantages. First, as CMOS image sensors become more dense, the depths of the photodiodes has increased. In fact, in certain embodiments, dopant is implanted into the device to create photodiodes. These photodiodes may be more than 5 μm thick. Thus, implant energies in excess of 10 MeV may be used to create the desired concentration profile. As photodiodes continue to become thicker, implant energies used to perform these implants will also continue to increase. The ability to perform implants at these implant energies is challenging and will become more so over time. For example, to achieve these higher implant energies, current implanters may need to be re-designed and built with a much larger footprint to withstand these extremely high voltages. The capital expenditure and time to implement implanters capable of greater than 10 MeV is prohibitive, thus exacerbating this issue.

By implanting the dopant through both surfaces of the epitaxial layer, the maximum implant energy is effectively reduced by 50%. This will enable the current capabilities of semiconductor processing equipment to be used to create deeper photodiodes than would otherwise be possible. Further, it allows next generation semiconductor processing equipment to create the next generation photodiodes that are twice as deep as would otherwise be possible.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of fabricating an image sensor, comprising:
   forming an epitaxial layer on a surface of a wafer, wherein a first surface of the epitaxial layer comprises an exposed surface and a second surface of the epitaxial layer is disposed on the surface of the wafer;
   performing a first implant by implanting dopant through the first surface and into the epitaxial layer;
   forming circuitry and electrical contacts on the first surface;
   bonding a handle wafer to the electrical contacts;
   thinning the wafer;
   performing a second implant by implanting dopant through the second surface and into the epitaxial layer;
   performing a thermal treatment to anneal the dopant; and
   forming optical components on the second surface.

2. The method of claim 1, wherein the first implant and the second implant are each performed using a plurality of implant energies.

3. The method of claim 1, wherein a maximum implant energy is selected such that dopant is implanted at a depth that is at least 50% of a thickness of the epitaxial layer.

4. The method of claim 1, further comprising creating deep trench isolation in the epitaxial layer.

5. The method of claim 4, wherein the deep trench isolation is created by implanting a second dopant having an opposite conductivity as the dopant into the epitaxial layer through the first surface.

6. The method of claim 5, wherein the deep trench isolation is created by implanting a second dopant having an opposite conductivity as the dopant into the epitaxial layer through the second surface.

7. The method of claim 4, wherein the deep trench isolation is created by implanting a second dopant having an opposite conductivity as the dopant into the epitaxial layer through the second surface.

8. The method of claim 4, wherein the dopant comprises a N-type dopant and the deep trench isolation is formed by implanting a P-type dopant.

9. The method of claim 1, wherein the thermal treatment comprises a laser anneal.

10. The method of claim 1, wherein the thermal treatment is performed following the second implant and before forming the optical components.

* * * * *